(12) United States Patent
Li et al.

(10) Patent No.: US 9,538,680 B2
(45) Date of Patent: Jan. 3, 2017

(54) LAMINATED BUSBAR FOR POWER CONVERTER AND THE CONVERTER THEREOF

(71) Applicant: DELTA ELECTRONICS, INC., Taoyuan Hsien (TW)

(72) Inventors: Yan Li, Taoyuan Hsien (TW);
Hongjian Gan, Taoyuan Hsien (TW);
Senlin Wen, Taoyuan Hsien (TW);
Jianping Ying, Taoyuan Hsien (TW)

(73) Assignee: DELTA ELECTRONICS, INC., Taoyuan (TW)

(*) Notice: Subject to any disclaimer, the term of this patent is extended or adjusted under 35 U.S.C. 154(b) by 710 days.

(21) Appl. No.: 13/839,032

(22) Filed: Mar. 15, 2013

(65) Prior Publication Data
US 2014/0111959 A1 Apr. 24, 2014

(30) Foreign Application Priority Data
Oct. 22, 2012 (CN) .......................... 2012 1 0403971

(51) Int. Cl.
| | | |
|---|---|---|
| *H05K 7/02* | (2006.01) | |
| *H02M 7/00* | (2006.01) | |
| *H02M 7/487* | (2007.01) | |
| *H02M 1/34* | (2007.01) | |

(52) U.S. Cl.
CPC ............. *H05K 7/026* (2013.01); *H02M 7/003* (2013.01); *H02M 7/487* (2013.01); *H02M 2001/348* (2013.01)

(58) Field of Classification Search
CPC ....... H05K 7/026; H02M 7/487; H02M 7/003; H02M 2001/348; H02M 7/4835; H02M 7/483
See application file for complete search history.

(56) References Cited

U.S. PATENT DOCUMENTS

| | | | | |
|---|---|---|---|---|
| 6,028,779 A | * | 2/2000 | Sakamoto ............. | H02M 7/003 363/132 |
| 6,456,516 B1 | * | 9/2002 | Bruckmann .......... | H02M 7/003 363/144 |
| 2009/0219696 A1 | * | 9/2009 | Nakayama ............ | H02M 7/003 361/709 |
| 2009/0268496 A1 | * | 10/2009 | Tan ..................... | H02M 1/4216 363/126 |

(Continued)

*Primary Examiner* — Gustavo Rosario Benitez
(74) *Attorney, Agent, or Firm* — Yunling Ren; Eaton & Van Winkle

(57) ABSTRACT

The present application discloses a laminated busbar arrangement for use in a three-level power converter and a power converter. The laminated busbar arrangement comprises a first layer of busbar comprising a neutral-point sub busbar configured to make electrical connections between respective components in the three-level power converter and a neutral-point potential; a second layer of busbar comprising a plurality of sub busbars configured make electrical connections between the respective components in the three-level power converter and a positive direct current (DC) input, a negative DC input and an alternating current (AC) input/output in the three-level power converter, and between respective semiconductor switching components. The present application may effectively reduce stray inductance.

12 Claims, 10 Drawing Sheets

(56) References Cited

U.S. PATENT DOCUMENTS

2010/0253295 A1* 10/2010 Tan .................... H02M 1/42
  323/205
2010/0315776 A1* 12/2010 Ono .................... H02M 7/487
  361/689
2014/0254228 A1* 9/2014 Ying .................. H02M 7/5387
  363/132

* cited by examiner

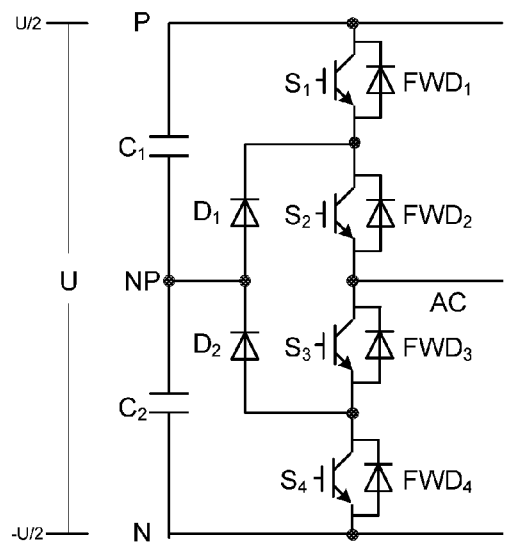
Fig. 1 (Prior Art)
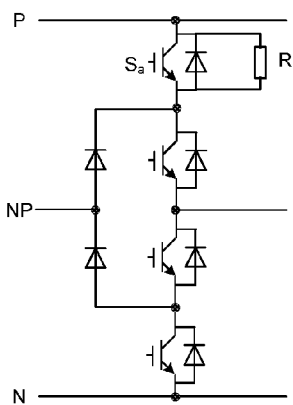
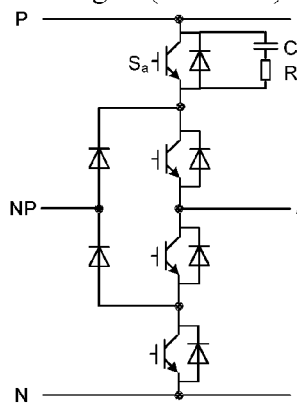
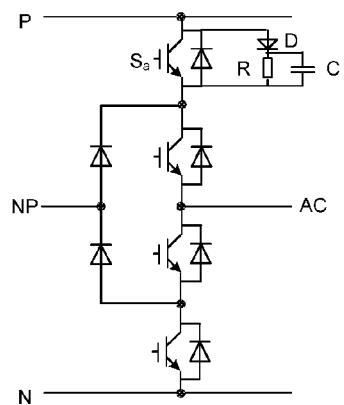
Fig.2A (Prior Art)　　　Fig.2B (Prior Art)　　　Fig.2C (Prior Art)

LAMINATED BUSBAR FOR POWER CONVERTER AND THE CONVERTER THEREOF

CROSS-REFERENCE TO RELATED APPLICATIONS

The present application claims priority under 35 U.S.C. §119 to Chinese Patent Application No. 201210403971.1, filed on Oct. 22, 2012, the entire contents of which are incorporated herein by reference.

TECHNICAL FIELD

The present application relates to a laminated busbar, and particularly to a laminated busbar structure having two layers of busbars and a NPC (neutral-point clamp) three-level power converter with the laminated busbar.

BACKGROUND ART

Presently, variable frequency converters are widely used in industry fields and are tending to be developed to high voltage, large current, high power density, high reliability and low cost. In high voltage variable frequency field, since the power converter is restricted by the performance of semiconductor components, a NPC three-level topology is generally used.

FIG. 1 is a circuit diagram showing one phase of the circuit of a typical NPC three-level topology. Although FIG. 1 only exemplarily shows one phase of the circuit of a typical NPC three-level topology, for the NPC three-level topology with three phases, the other two phases have the same feature as that of the circuit shown in FIG. 1. In FIG. 1, $S_1$, $S_2$, $S_3$ and $S_4$ are semiconductor components, $FWD_1$, $FWD_2$, $FWD_3$ and $FWD_4$ respectively connected in parallel with $S_1$, $S_2$, $S_3$ and $S_4$ are freewheeling diodes, $D_1$ and $D_2$ are natural point clamping diodes, $C_1$ is capacitor for upper-arm, $C_2$ is capacitor for lower-arm, P is a positive DC (direct current) bus, N is a negative DC bus, NP is a neutral-point bus, and AC is an AC (alternating current) input/output bus.

As shown in FIG. 1, such a NPC three-level topology is characterized in that the voltage stress of each of semiconductor components is reduced by half, comparing with the two-level topology, the number of semiconductor components contained in the power unit increases and the structure thereof becomes more complicated, stray inductance in the power unit increases and can't be ignored any more. In particular, as switching speed of semiconductor components and power output are increasingly improved, stray inductance induces a high voltage when a semiconductor component turns off under normal operation or short-circuit, which may increase voltage stress to the semiconductor component, thereby reducing reliability and even damaging the semiconductor component. Therefore, it is significantly important to appropriately arrange power units so as to reduce stray inductance.

FIGS. 2A-2C is circuit diagrams showing an example of a method for reducing an influence of voltage induced by stray inductance on a semiconductor component in a conventional neutral-point clamp three-level topology.

As shown in FIGS. 2A-2C, in the art, in order to reduce the influence of voltage induced by stray inductance in NPC three-level topology on semiconductor components, a conventional method adds a snubber circuit (clamping circuit) connected in parallel with semiconductor component, and the typical snubber circuit is R, RC, RCD, and so on. When a semiconductor component $S_1$ is turned off, energy existing on stray inductance is absorbed by an energy-storage element in the snubber circuit, and thus the voltage across the semiconductor component $S_1$ can be suppressed. Although this method can reduce the influence simply and effectively, when $S_1$ is turned on, energy absorbed by the snubber circuit is released through $S_1$, which leads to additional turned-on loss and deteriorates dynamic performance of semiconductor components. In addition, since additional high voltage devices are added, the converter has disadvantages of an increased failure rate, a reduced power density, an improved cost, and so on.

Presently, another method for reducing stray inductance is laminated busbar. The laminated busbar has advantages of small stray inductance and effective suppression of EMI (Electro Magnetic Interference), and so on. Therefore, laminated busbars are widely applied to large power frequency conversion field.

In order to reduce stray inductance, laminated busbar should supply path that makes currents through respective layers of conductor parts take on mirror symmetry. The higher the symmetry is, the smaller the area of the current commutation loop in the conductor part is and the less the magnetic flux is in case of constant flux density, and thus the less the stray inductance is. Although stray inductance can be approximately ignored when laminated busbar used, some other problems still exist in such laminated busbars in the art. For example, particularly in the NPC three-level circuit, since the number of components increases, and the area of components itself increases, multiple layers of laminated busbars are required to achieve so complicated electrical connection, and the manufacturing cost of such multiple layers of laminated busbars becomes high. In addition, as the layer number of busbars increases, stray inductance increases due to the increasing thick of insulating layers located between layers, and the insulating process between layers becomes more complicated.

For example, U.S. Pat. No. 6,456,516B1, titled as "Provision of a low-inductive rail for three-point phase module", discloses a laminated busbar structure. The laminated busbar proposed by this patent document is designed as three layers of laminated busbars, and may be extended to a NPC three-level topology having N semiconductor switching components in series connection. Although stray inductance is reduced to some extent in this patent, the laminated busbar in this patent is still a busbar with multiple layers, and thus corresponding thick of insulating layers need to be interposed between every two layers by an insulating process, which leads to the laminated busbar thick as a whole and causes the reduction in stray inductance depending on the thick of the insulating layer. In addition, in this patent, the shapes of respective sub busbars are different from each other, and it is required to process bends and steps with different depths in respective layers so as to connect each of layer of busbar with corresponding pins of semiconductor components, which makes the manufacturing process of busbar complicated, and it is necessary to make adherence processing between the respective busbars so as to avoid gaps between laminated layers due to bending of busbar. Therefore, the electrical performance of such busbar structure is weak and counts against cost optimization.

Similarly, another U.S. Pat. No. 7,881,086B2, titled as "Power conversion device and fabricating method for the same" discloses a laminated busbar structure. The laminated busbar proposed by this U.S. Pat. No. 7,881,086B2 also comprises a busbar with multiple layers (4 layers). Thus, there exist such problems that the layer number of busbars is too many to weaken the effect of the realization of low stray inductance, it is required to process different holes since the shapes of respective sub busbars are different from each other, and too many laminated layers needs to more holes (more through holes). Therefore, the laminated busbar proposed by this patent is also complicated and counts against cost optimization.

DISCLOSURE OF THE INVENTION

To solve at least one of the above-mentioned problems, an object of the present application is to provide a laminated busbar for use in a NPC three-level power converter, which effectively reduces stray inductance in the power converter, and has a simple structure and is easy to install.

To achieve the above object, a first aspect of the present application is to provide a laminated busbar for use in a NPC three-level power converter proposed by the present application comprises: a first layer of busbar comprising a neutral-point sub busbar configured to make electrical connections between respective components in the converter and a neutral-point potential; and a second layer of busbar comprising a plurality of sub busbars configured to make electrical connections between the respective components in the converter and a positive direct current (DC) input, a negative DC input, and an alternating current (AC) input/output in the converter, and between respective semiconductor switching components.

A second aspect of the present application is to provide a NPC three-level power converter with low stray inductance, comprising; a semiconductor component group comprising an upper-arm component group connected between a positive DC input and an AC input/output, and a lower-arm component group connected between a negative DC input and the AC input/output, wherein the upper-arm component group includes a first clamping diode, a terminal of which is connected to a neutral-point potential located between the upper-am component group and the lower-arm component group, and the lower-arm component group comprises a second clamping diode, a terminal of which is connected to the neutral-point potential; a heat sink, on which the upper-arm component group and the lower-arm component group are mounted on; and a laminated busbar dispose over the semiconductor component group, comprising: a first layer of busbar including a neutral-point sub busbar configured to make electrical connections between the first clamping diode, the second clamping diode and the neutral-point potential; and a second layer of busbar including a plurality of sub busbars configured to make electrical connections between the upper-arm component group and the positive DC input, the negative DC input, and the AC input/output, electrical connections between the lower-am component group and the negative DC bus, the AC input/output, and electrical connections between the respective components in the upper-arm component group and the lower-arm component group, respectively.

The present application can provide a mirror path for currents flowing through the circuit at commutation step. That is, the directions in which the currents flow through an upper layer busbar and a lower layer busbar at commutation step are opposite to each other, and thus stray inductance in the power converter is effectively reduced, the voltage stress at the time when the component is turned off is reduced, and the two layers of busbars structure is easy to achieve and install.

These and other aspects of the present application will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the application and together with the written description, serve to explain the principles of the application. Wherever possible, the same reference numbers are used throughout the drawings to refer to the same or like elements of the embodiments, and wherein:

FIG. 1 is a circuit diagram showing one phase of the circuit of a typical diode-clamp three-level topology;

FIGS. 2A-2C are circuit diagrams showing an example of a method for reducing an influence of voltage induced by stray inductance on a semiconductor component in a conventional NPC three-level topology;

DETAILED DESCRIPTION OF THE PREFERRED EMBODIMENTS

Figure 3A:
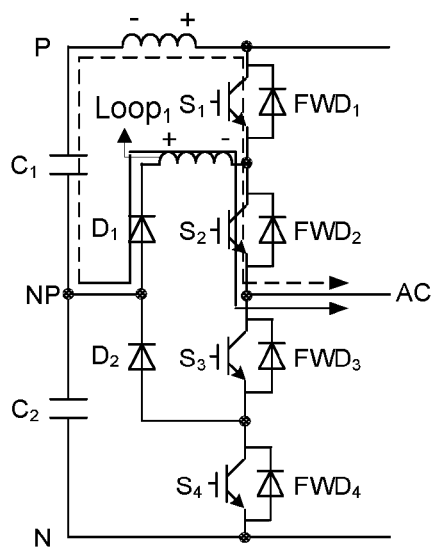
FIGS. 3A-3D are circuit diagrams showing four commutation loops in one phase of the circuit of a power converter having a NPC three-level topology during normal operation, respectively.

Hereinafter, the embodiments of the present application are described in detail. It should be noted that the embodiments are only illustrative, not limit the present application.

The present application will now be described more fully hereinafter with reference to the accompanying drawings, in which exemplary embodiments of the application are shown. This application may, however, be embodied in many different forms and should not be construed as limited to the embodiments set forth herein. Rather, these embodiments are provided so that this disclosure will be thorough and complete, and will fully convey the scope of the application to those skilled in the art. Like reference numerals refer to like elements throughout.

The terminology used herein is for the purpose of describing specific embodiments only and is not intended to be limiting of the application. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements and/or components, but do not preclude the presence or addition of one or more other features, regions, integers, steps, operations, elements, components and/or groups thereof.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

FIGS. 3A-3D are circuit diagrams showing four commutation loops in one phase of the circuit of a power converter having a NPC three-level topology during normal operation, respectively.

A commutation loop 1 is shown in FIG. 3A. With reference to FIG. 3A, the commutation loop 1 flows from an upper-arm busbar capacitor $C_1$, semiconductor component $S_1$, clamping diode $D_1$ and connectors between the above components, to an AC output terminal, as shown by arrows in FIG. 3A. Since the current flowing through $S_1$ is reduced and the current flowing through the clamping diode $D_1$ is increased when $S_1$ transits from on-state to off-state, the voltage induced by stray inductance may be applied across $S_1$ (the direction thereof is shown in FIG. 3A), and thus the electric stress to $S_1$ is increased.

Figure 3B:
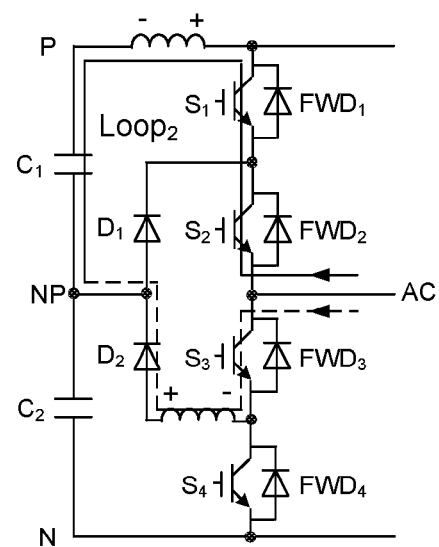

A commutating loop 2 is shown in FIG. 3B. With reference to FIG. 3B, the commutation loop 2 flows from the AC terminal and through the upper-arm busbar capacitor $C_1$, freewheeling diodes $FWD_1$ and $FWD_2$, semiconductor component $S_3$, clamping diode $D_2$ and connectors between the above components, as shown by arrows in FIG. 3B. Since the current flowing through $S_3$ and $D_2$ is reduced and current flowing through the freewheeling diodes $FWD_1$ and $FWD_2$ is increased when $S_3$ transits from on-state to off-state, the voltage induced by stray inductance may be applied across $S_3$ (the direction thereof is shown in FIG. 3B), and thus the electric stress to $S_3$ is increased.

Figure 3C:
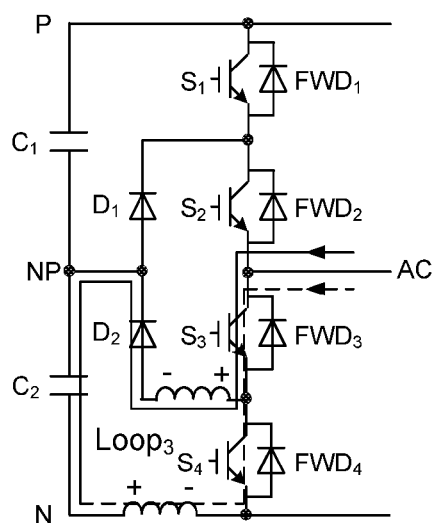

A commutation loop 3 is shown in FIG. 3C. With reference to FIG. 3C, the commutation loop 3 flows from the AC terminal and through a lower-arm busbar capacitor $C_2$, semiconductor component $S_4$, clamping diode $D_2$ and connectors between the above components, as shown by arrows in FIG. 3C. Since the current flowing through $S_4$ is reduced and the current flowing through the clamping diode $D_2$ is increased when $S_4$ transits from on-state to off-state, the voltage induced by stray inductance may be applied across $S_4$ (the direction thereof is shown in FIG. 3C), and thus the electric stress to $S_4$ is increased.

Figure 3D:
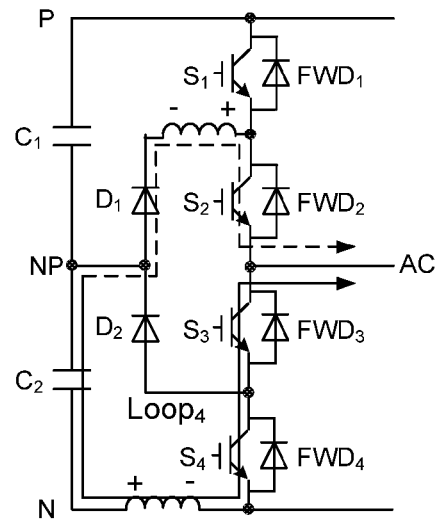

A commutation loop 4 is shown in FIG. 3D. With reference to FIG. 3D, the commutation loop 4 flows from the lower-arm busbar capacitor $C_2$, semiconductor component $S_2$, freewheeling diodes $FWD_3$ and $FWD_4$, clamping diode $D_1$ and connectors between the above components, to an AC output terminal, as shown by arrows in FIG. 3D. Since the current flowing through $S_2$ and the clamping diode $D_1$ is reduced and the current flowing through $FWD_3$ and $FWD_4$ is increased when $S_2$ transits from on-state to off-state, the voltage induced by stray inductance may be applied across $S_2$ (the direction thereof is shown in FIG. 3D), and thus electric stress to $S_2$ is increased.

Therefore, in a NPC three-level power converter, when the states of components change, the voltage induced by stray inductance may increase voltage stress to the semiconductor components, thereby affecting the performance and destroying them, improving the requirement for the performance of the semiconductor components when manufacturing a power converter, and thus increasing manufacturing cost thereof. The above negative effects may be eliminated by reducing the stray inductance of the power converter.

Therefore, the present application provide a laminated busbar for a NPC three-level power converter, comprising two layers of busbars, wherein one layer of busbar comprises a neutral-point sub busbar configured to make electrical connection between components of the NPC three-level power converter and a neutral-point potential, and another layer of busbar may comprise a plurality of sub busbars, respectively configured to make electrical connections between the respective components of the NPC three-level power converter and a positive DC input, a negative DC input, an AC input/output and electrical connections between the respective components.

In a laminated busbar according to an embodiment of the present application, the main parts of the two busbars are respectively located in two different planes. Here, the main part of each layer of busbar refers to a busbar conductor part of each layer of busbar, which will be later described in detail.

The present application can provide a mirror path for current flowing through the circuit during commutation step by means of designing two layers of busbars, that is, the directions of current flowing through the upper and lower layers of busbars at the commutation step take on mirror symmetry, thereby the stray inductance in a power converter may be effectively reduced and the voltage stress may be decreased when semiconductor components are turned off, and two-layer busbar structure can be achieved and installed easily.

As compared with the method in FIGS. 2A-2C, the present application doesn't increase the number of components, thereby simplifying manufacturing process, and the dynamic characteristics of semiconductor components may not be influenced. Moreover, failure rate and power density of the converter aren't reduced and the cost thereof isn't increased since no additional component is added.

As compared with the laminated busbar proposed by U.S. Pat. No. 6,456,516B1, in case of the same voltage level, the same insulating material and the same insulating process, the operation voltage between the two layers of busbars according to the present application is half of a bus voltage, and such arrangement only requires one layer of insulator, the thickness of which is half of that of three layers of busbars arrangement. Therefore, stray inductance in the two layers of busbars in the present application is smaller than that in three layers. In addition, the manufacturing process of busbars in the present application is simple, and the cost thereof is low since the shapes of the busbars are similar to each other and the busbars need no specific process such as bending, adherence, and so on.

As compared with the laminated busbar proposed by U.S. Pat. No. 7,881,086B2, in case of the same voltage level, the same insulating material and the same insulating process, the number of busbar layers in the present application is significantly reduced and also the number of insulating layers, thus stray inductance is correspondingly reduced. In addition, the number of connection holes on the laminated busbars in the present application is reduced, thereby the manufacturing cost of the busbars is lowered.

The laminated busbar for the NPC three-level power converter according to the present application will be described by different embodiments.

A First Embodiment

Figure 4A:
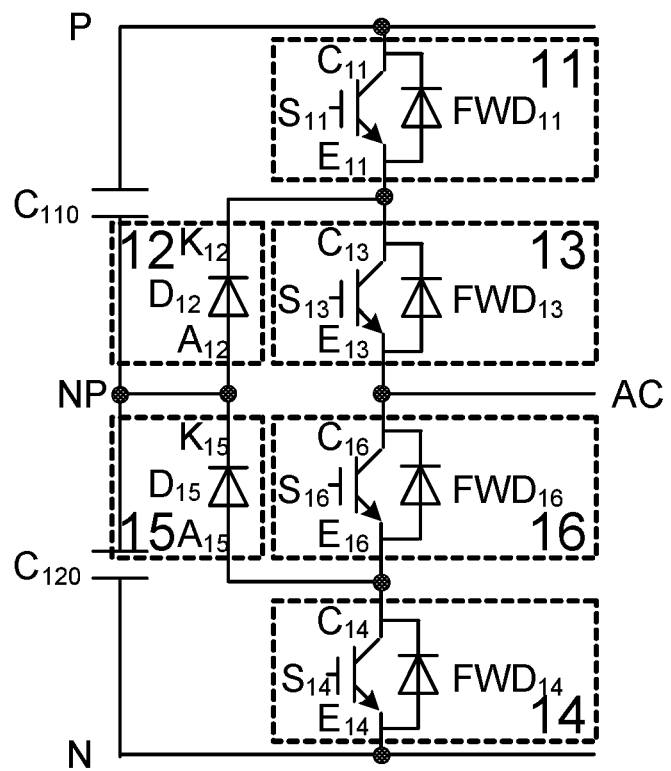
FIG. 4A is a schematic diagram showing a circuit of a power converter having a NPC three-level topology according to a first embodiment of the present application.

As shown in FIG. 4A, an upper arm in one phase of the circuit of a power converter having a NPC three-level topology comprises semiconductor components $S_{11}$ and $S_{13}$, freewheeling diodes $FWD_{11}$ and $FWD_{13}$ respectively connected in parallel with $S_{11}$ and $S_{13}$, and a lower arm thereof comprises semiconductor components $S_{14}$ and $S_{16}$, freewheeling diodes $FWD_{14}$ and $FWD_{16}$ respectively connected in parallel with $S_{14}$ and $S_{16}$. A terminal of a clamping diode $D_{12}$ is connected to $S_{11}$ and $S_{13}$ of the upper arm, and the other terminal thereof is connected to a neutral-point potential. A terminal of a clamping diode $D_{15}$ is connected to $S_{14}$ and $S_{16}$ of the lower arm, and the other terminal thereof is connected to the neutral-point potential. An upper-arm busbar capacitor $C_{110}$ is connected in series between a positive DC input and the neutral-point potential, and a lower-arm busbar capacitor $C_{120}$ is connected in series between a negative DC input and the neutral-point potential. In FIG. 4A, "P" indicates the positive DC input, "N" indicates the negative DC input, "NP" indicates the neutral-point potential, and "AC" indicates the AC input/output.

In this embodiment, according to connection relationships between the respective components in the power converter, the components in the power converter constitute different semiconductor modules, and thus a laminated busbar structure may be correspondingly disposed according to these modules. For example, as shown in FIG. 4A, $S_{11}$ and $FWD_{11}$ connected in parallel with thereof constitute a semiconductor module 11; $D_{12}$ constitutes a semiconductor module 12; $S_{13}$ and $FWD_{13}$ connected in parallel with thereof constitute a semiconductor module 13; $S_{14}$ and $FWD_{14}$ connected in parallel with thereof constitute a semiconductor module 14, $D_{15}$ constitutes a semiconductor module 15; $S_{16}$ and $FWD_{16}$ connected in parallel with thereof constitute a switching component module 16.

Figure 4B:
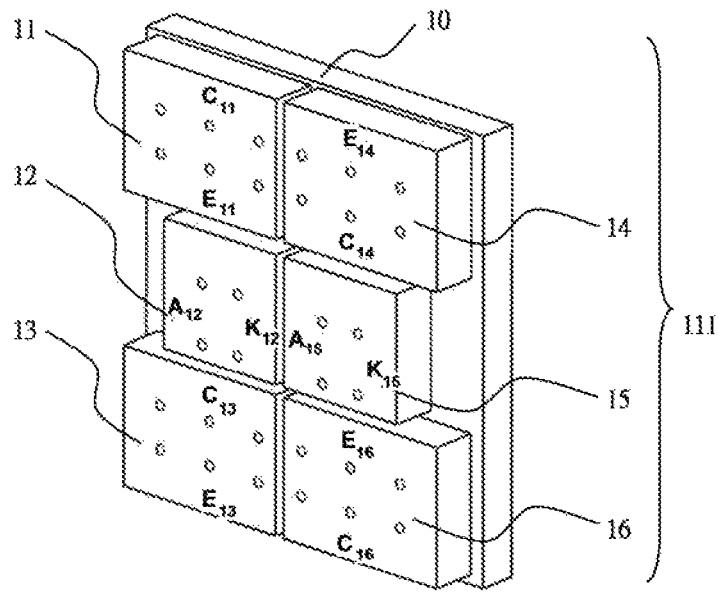
FIG. 4B is a schematic diagram showing a component distribution of the power converter having the NPC three-level topology according to the first embodiment of the present application.

The plurality of semiconductor modules form a power unit component group (or called as semiconductor component group) 111 in the power converter. As shown in FIG. 4B, the power unit device group 111 may comprise six switching component modules 11, 12, 13, 14, 15 and 16 located in the same plane, all of which are fixed on the same heat sink 10.

With reference to FIG. 4B, in order to make currents which flows through the laminated busbar in the upper and lower layers, mirror symmetry at the commutation step, according to electrical connections between the respective components in the NPC three-level circuit topology, the semiconductor modules 11, 12 and 13 are disposed at one side, and 14, 15 and 16 are disposed at another side opposite to the one side. In addition, preferably the module 11 is parallel with 14, the module 12 is parallel with 15, and the module 13 is parallel with 16.

Figure 5A:
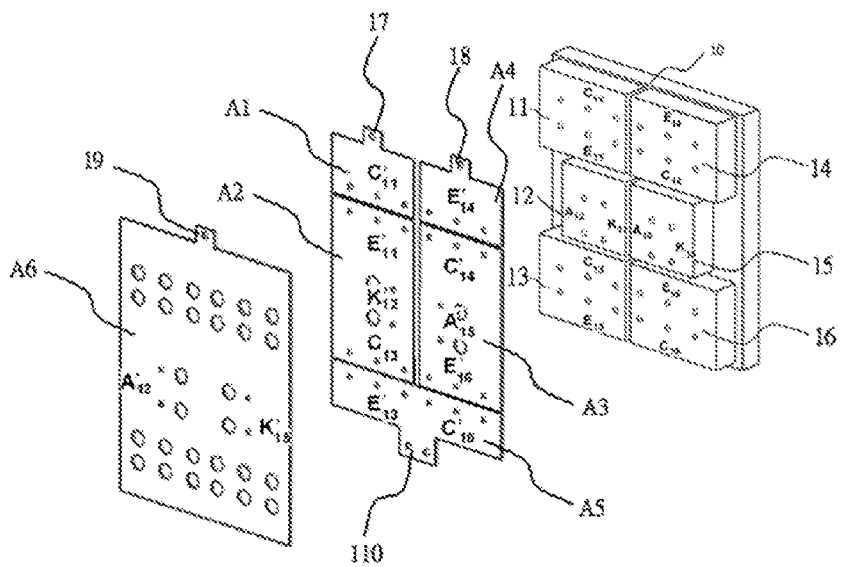
FIG. 5A is a schematic diagram showing the structure of each phase of power unit in the power converter having the NPC three-level topology according to the first embodiment of the present application.
Figure 7A:
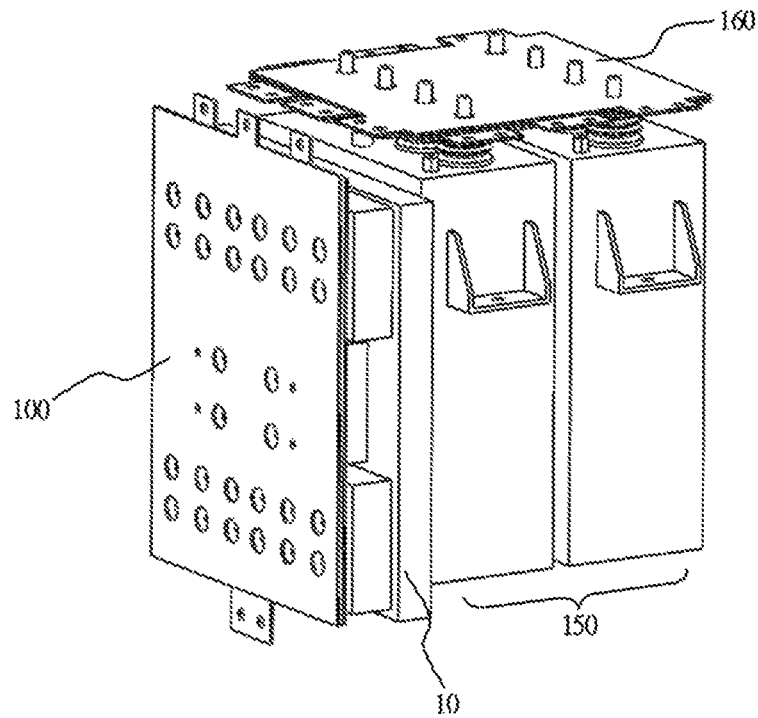
FIG. 7A is a schematic diagram showing the assembly of one phase of power unit in the power converter having the NPC three-level topology according to the first embodiment of the present application.

With reference to FIGS. 5A and 7A, in the power converter having the NPC three-level topology according to this embodiment, one phase of power unit 100 in the power converter is taken as an example to illustrate the structure of the power unit. The power unit 100 mainly comprises a heat sink 10, a component group 111 including the semiconductor component modules 11, 12, 13, 14, 15 and 16, and the sub busbars A1, A2, A3, A4, A5 and A6, each of the sub busbars being divided into conductor part and connector part by function. In this embodiment, the respective sub busbars are respectively connected to corresponding components in the power unit. Specifically, a pin $C_{11}$ of the 11 is connected to a connection hole $C_{11}'$ of the sub busbar A1, and connector 17 of the sub busbar A1 is used as the positive DC input terminal, which is connected to a positive DC input bus via upper-arm capacitor $C_{110}$. A pin $E_{11}$ of 11, a pin $K_{12}$ of 12 and a pin $C_{13}$ of 13 are electrically connected to connection holes $E_{11}'$, $K_{12}'$ and $C_{13}'$ of the sub busbar A2, respectively. A pin $E_{13}$ of 13 and a pin $C_{16}$ of 16 are electrically connected to connection holes $E_{13}'$ and $C_{16}'$ of the sub busbar A5, respectively, and connector 110 of the sub busbar A5 is used as the AC input/output terminal. A pin $E_{16}$ of 16, a pin $A_{15}$ of 15 and a pin $C_{14}$ of 14 are electrically connected to connection holes $E_{16}'$, $A_{15}'$ and $C_{14}'$ of the sub busbar A3, respectively. A pin $E_{14}$ of 14 is electrically connected to a connection hole $E_{14}'$ of the sub busbar A4, and connector 18 of the sub busbar A4 is used as the negative DC input terminal, which is connected to a negative DC common bus via lower-arm capacitor $C_{120}$. A pin $A_{12}$ of 12 and a pin $K_{15}$ of 15 are electrically connected to connection holes $A_{12}'$ and $K_{15}'$ of the neutral-point sub busbar A6 disposed on the first layer, and connector 19 of the neutral-point sub busbar A6 is used as a neutral-point potential connection terminal in the one phase of the circuit of the power converter, which is connected to upper-arm capacitor $C_{110}$ and lower arm capacitor $C_{120}$.

Figures 5B, 5C:
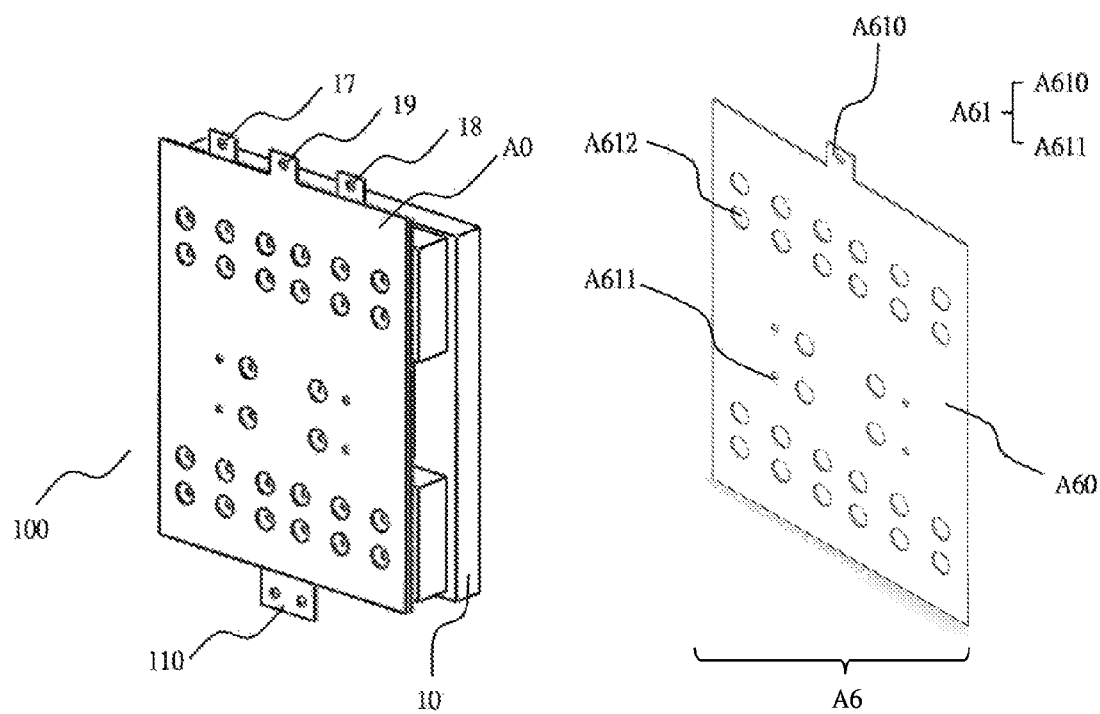
FIG. 5B is a schematic diagram showing the structure of the laminated busbar according to the first embodiment of the present application.
FIG. 5C is a schematic diagram showing the structure of a sub busbar A6 according to the first embodiment of the present application.

In FIG. 5B, in the laminated busbar A0 composed of the sub busbars A1, A2, A3, A4, A5 and A6, the connector 17 (i.e. the connector of the sub busbar A1) is connected to the positive DC input bus, the connector 18 (i.e. the connector of the sub busbar A4) is connected to the negative DC input bus, the connector 19 (i.e. the connector of the sub busbar A6) is connected to a neutral-point potential bus, and the connector 110 (i.e. the connector of the sub busbar A5) is connected to an AC input/output bus.

In FIG. 5B, in this embodiment, the laminated busbar A0 is positioned over the power unit component group 111. The laminated busbar A0 comprises two layers of busbars. A first layer of busbar in the laminated busbar A0 is a neutral-point sub busbar A6, which is a neutral-point potential bus of one phase of the circuit of the power converter having the NPC three-level topology, and comprises the connector 19. A second layer of busbar in the laminated busbar A0 comprises a plurality of sub busbars A1-A5, which make the electrical connections between the semiconductor modules and the positive DC busbar, the negative DC busbar and the AC input/output busbar, make the electrical connections between the semiconductor modules, and have the connector 17, 18 and 110.

Therefore, in this embodiment, the laminated busbar A0 comprises six sub busbars A1-A6. The present application takes the sub busbar A6 as an example to illustrate the structure of each of the sub busbars in this embodiment.

As shown in FIG. 5C, the sub busbar A6 comprises a conductor A60 and a connector A61. The conductor A60 is a portion of the sub busbar A6 which is used for providing a flow path for current through the semiconductor modules, and the connector A61 is used for connecting the conductor A60 with external device such as semiconductor module, capacitor, motor, cable or the like, in an effective connection manner. Depending on different connection objects, the connector A61 may comprise at least one of connection terminal A610, connection hole A611, through hole A612 or the like. For example, the connector A61 may be implemented as the connector 19 in FIG. 5A, and the connector 19 only comprises connection terminals and connection holes. Similarly, in other sub busbars, the connector may be implemented as the connector 17 and 18 in FIG. 5A, and the connector 17 and 18 also only comprise connection terminals and connection holes.

In the present application, as required, the busbar connector may be implemented in various manners, for example, bending toward space, rivet, protrusion or concave, bolt, buckle, connection hole and through hole in various shapes, and so on. According to an example of the present application, as connecting semiconductor modules by means of holes, each of the sub busbars in the laminated busbar is perforated in the positions corresponding to the positions of the respective components in the semiconductor modules. The holes may be classified into two types according to their diameters. A small hole having a smaller diameter is a connection hole, and each of sub busbars is electrically connected to the corresponding pin of the semiconductor modules via connection holes thereon. A big hole having a bigger diameter is a through hole, and the through holes in each of sub busbars are not electrically connected to the pins of the semiconductor modules. The drawings only indicate an example that holes are round holes, but those skilled in the art should appreciate that the shapes of holes are not limed to this, and may be holes in various shapes such as ellipse holes, square holes, and so on, as long as the holes can implement the functions of the above connection holes or the above through holes and be distinguished from each other according to the above two functions.

The laminated busbar A0 may further comprise an insulation material portion. The insulation material portion is sandwiched between two sub busbars having different operation voltages and stacked together. Take the laminated busbar A0 as an example, an insulating layer exists between the upper and lower layers of busbars, and the insulating layer may be attached to a surface of the sub busbar A6, or may be attached to surfaces of the sub busbars A1, A2, A3, A4 and A5, or may be attached to the surfaces of the sub busbars A1, A2, A3, A4, A5 and A6 simultaneously. The insulating layer may not be attached to any surface of the sub busbars, but independently located between the two layers of sub busbars, and the effective cling between the upper and lower layers of busbars is achieved by means of laminating, adhesion, and so on. As shown in FIGS. 5A and 5B, the neutral-point A6 is separately disposed at the top of the laminated busbar, and the operation voltages between the other sub busbars located in the second layer and the neutral-point A6 are half of the whole DC operation voltage of the power converter. However, in the second layer busbar, the operation voltages between a plurality of sub busbars, that is, between A1 and A2, between A2 and A5, between A3 and A5, between A3 and A4, and between A2 and A3 are also half of the whole DC operation voltage of the converter, and the operation voltage between A1 and A4 is equal to the whole DC operation voltage of the converter.

In this embodiment, the laminated busbar is arranged in two layers, which makes currents flowing through the upper and lower layers of busbars mirror symmetry substantially, thus effectively reducing stray inductance in the power converter, and further reduces voltage stress to the switching components. Further, the neutral-point sub busbar arranged in one of two layers may completely cover all of busbars arranged in another layer, which further reduces stray inductance in the power converter.

Hereafter, the influence of laminated busbar according to this embodiment on stray inductance in a NPC three-level power converter will be described with reference to FIGS. 6A-6D.

Figure 6A:
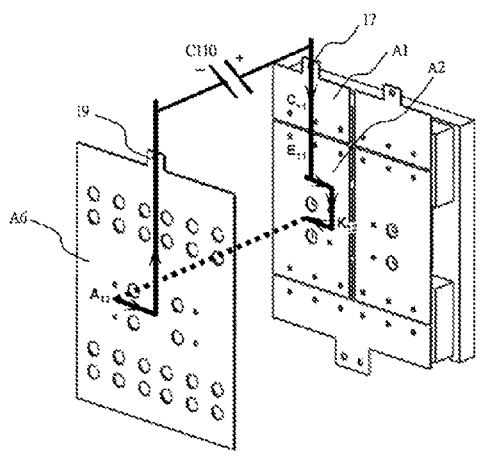
FIG. 6A is a schematic diagram showing a distribution of a commutation loop 1 in the laminated busbar according to the first embodiment of the present application.
Figure 6B:
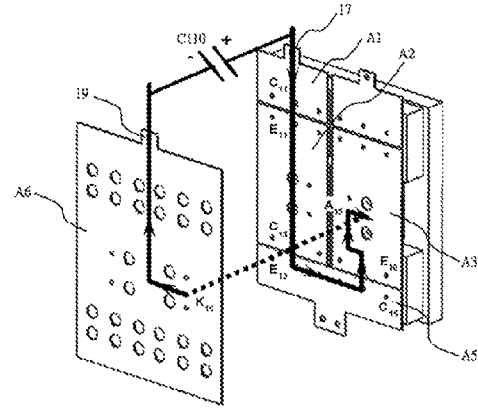
FIG. 6B is a schematic diagram showing a distribution of a commutation loop 2 in the laminated busbar according to the first embodiment of the present application.
Figure 6C:
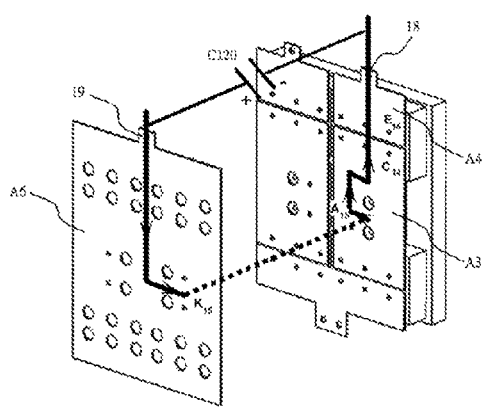
FIG. 6C is a schematic diagram showing a distribution of a commutation loop 3 in the laminated busbar according to the first embodiment of the present application.
Figure 6D:
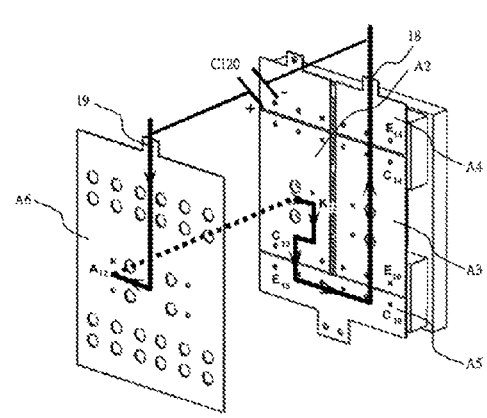
FIG. 6D is a schematic diagram showing a distribution of a commutation loop 4 in the laminated busbar according to the first embodiment of the present application.

FIG. 6A is a schematic diagram showing a distribution of a commutation loop 1 in the laminated busbar according to a first embodiment of the present application. FIG. 6B is a schematic diagram showing a distribution of a commutation loop 2 in the laminated busbar according to the first embodiment of the present application. FIG. 6C is a schematic diagram showing a distribution of a commutation loop 3 in the laminated busbar according to the first embodiment of the present application. FIG. 6D is a schematic diagram showing a distribution of a commutation loop 4 in the laminated busbar according to the first embodiment of the present application.

With reference to FIG. 3A and FIG. 6A, at the time when semiconductor component $S_{11}$ is turned off, commutation loop 1 flows through sub busbar A1, semiconductor module 11, sub busbar A2 and semiconductor module 12 which are disposed in the first layer, and neutral-point sub busbar A6 which is disposed in the second layer. Specifically, the current in the commutation loop 1 flows through the route of $C_{110}$-$C_{11}$-$E_{11}$-$K_{12}$-$A_{12}$-$C_{110}$, that is, beginning from anode terminal of upper-arm busbar capacitor $C_{110}$, to the semiconductor module 11 via sub busbar A1 and terminal $C_{11}$ of semiconductor module 11, further leading from another terminal $E_{11}$ of semiconductor module 11, to semiconductor module 12 via sub busbar A2 and terminal $K_{12}$ of semiconductor module 12, further leading from another terminal $A_{12}$ of semiconductor module 12, and ending at cathode terminal of upper-arm busbar capacitor $C_{110}$ via neutral-point sub busbar A6. Since A6 and A1, A2 are located on the different plane, and preferably A6 completely covers them, the current path of commutation loop 1 is overlapped, and thus the generated stray inductance is very small. The more commutation loop 1 overlaps, the smaller stray inductance commutation loop 1 causes.

With reference to FIG. 3B and FIG. 6B, at the time when semiconductor component $S_{13}$ is turned off, commutation loop 2 flows through the sub busbar A1, semiconductor module 11, sub busbar A2, semiconductor module 13, sub busbar A5, semiconductor module 16, sub busbar A3, semiconductor module 15 and neutral-point sub busbar A6. Specifically, the current in the commutation loop 2 flows through the path of $C_{110}$-$C_{11}$-$E_{11}$-$C_{13}$-$E_{13}$-$C_{16}$-$E_{16}$-$A_{15}$-$K_{15}$-$C_{110}$, that is, beginning from anode terminal of upper-arm busbar capacitor $C_{110}$, to semiconductor module 11 via sub busbar A1 and terminal $C_{11}$ of semiconductor module 11, further leading from another terminal $E_{11}$ of semiconductor module 11, to semiconductor module 13 via sub busbar A2 and terminal $C_{13}$ of semiconductor module 13, further leading from another terminal $E_{13}$ of semiconductor module 13, to semiconductor module 16 via sub busbar A5 and terminal $C_{16}$ of semiconductor module 16, further leading from another terminal $E_{16}$ of semiconductor module 16, to semiconductor module 15 via sub busbar A3 and terminal $A_{15}$ of semiconductor module 15, further leading from another terminal $K_{15}$ of semiconductor component 15, and ending at cathode terminal of upper-arm busbar capacitor $C_{110}$ via sub busbar A6. Since A6 and A1, A2, A5, A3 are located on the different planes, and preferably A6 completely covers them, the current path of commutation loop 2 is overlapped, and thus the generated stray inductance is very small. The more commutation loop 2 overlaps, the smaller stray inductance commutation loop 2 causes.

With reference to FIG. 3C and FIG. 6C, at the time when semiconductor component $S_{14}$ is turned off, commutation loop 3 flows through sub busbar A4, semiconductor module 14, sub busbar A3, semiconductor module 15 and neutral-point sub busbar A6.
Specifically, the current in the commutation loop 3 flows through the path of $C_{120}$-$E_{14}$-$C_{14}$-$A_{15}$-$K_{15}$-$C_{120}$, that is, beginning from anode terminal of lower-arm busbar capacitor $C_{120}$, to semiconductor module 15 via neutral-point sub busbar A6 and terminal $K_{15}$ of semiconductor module 15, further leading from another terminal $A_{15}$ of semiconductor module 15, to semiconductor module 14 via sub busbar A3 and terminal $C_{14}$ of semiconductor module 14, further leading from another terminal $K_{14}$ of semiconductor module 14, and ending at cathode terminal of lower-arm busbar capacitor $C_{120}$ via sub busbar A4. Since A6 and A3, A4 are located on the different planes, and preferably A6 completely covers them, the current path of commutation loop 3 is overlapped, and thus the generated stray inductance is very small. The more commutation loop 3 overlaps, the smaller stray inductance commutation loop 3 causes.

With reference to FIG. 3D and FIG. 6D, at the time when semiconductor component $S_{12}$ is turned off, commutation loop 4 flows through sub busbar A4, semiconductor module 14, sub busbar A3, semiconductor module 16, sub busbar A5, semiconductor module 13, sub busbar A2, semiconductor module 12 and neutral-point sub busbar A6. Specifically, the current in the commutation loop 4 flows through the path of $C_{120}$-$A_{12}$-$K_{12}$-$C_{13}$-$E_{13}$-$C_{16}$-$E_{16}$-$C_{14}$-$C_{120}$, that is, beginning from anode terminal of lower-arm busbar capacitor $C_{120}$, to semiconductor module 12 via neutral-point sub busbar A6 and terminal $A_{12}$ of semiconductor module 12, further leading from another terminal $K_{12}$ of semiconductor module 12, to semiconductor module 13 via sub busbar A2 and terminal $C_{13}$ of semiconductor module 13, further leading from another terminal $E_{13}$ of semiconductor module 13, to semiconductor module 16 via sub busbar A5 and terminal $C_{16}$ of semiconductor module 16, further leading from another terminal $E_{16}$ of semiconductor module 16, to semiconductor module 14 via sub busbar A3 and terminal $C_{14}$ of semiconductor module 14, further leading from another terminal $E_{14}$ of semiconductor module 14, and ending at cathode terminal of lower-arm busbar capacitor $C_{120}$ via sub busbar A4. Since A6 and A2, A5, A3, A4 are located on the different planes, and preferably A6 completely covers them, the current path of commutation loop 4 is overlapped, and thus the generated stray inductance is very small. The more commutation loop 4 overlaps, the smaller stray inductance commutation loop 4 causes.

As described above, the first embodiment of the present application provides mirror path for currents at the commutation step in principle, reduces the area of commutation loop, and thus effectively reduces stray inductance. As compared with multiple layers of laminated busbars, stray inductance in the present application may be reduced more. Meanwhile, the laminated busbar only comprises two layers, and for the connections between the respective sub busbars in each of the two layers and the semiconductor modules, it is not required to make a specific process, and thus the laminated busbar according to this embodiment has a structure which is simplified and easy to manufacture.

As a modification of the first embodiment, the positions of the semiconductor modules 11 and 14, the positions of the semiconductor module 12 and 15, and the positions of the semiconductor module 13 and 16 may be exchanged. Correspondingly, the positions of the sub busbar A1 and A4 and the positions of the sub busbar A2 and A3 are exchanged, and thereby the decrease in stray inductance may be also achieved. According to the laminated busbar described above, those skilled in the art should appreciate that the present application may be implemented in other structure of the semiconductor modules 11-16 and the sub busbars, as long as it can make currents in the laminated busbars substantial mirror.

Hereafter, an assembly of one phase of power unit of the power converter having a NPC three-level topology according to this embodiment will be described with reference to FIG. 7A and FIG. 7B.

As shown in FIG. 7A, the power unit 100 further comprises a capacitor group 150 and a DC laminated busbar 160. The 150 comprises an upper-arm capacitor $C_{110}$ and a lower arm capacitor $C_{120}$. Since voltages involved in the power converter are very high, the capacitors employed in the present application have big sizes, and it is preferable to provide the DC laminated busbar 160 for connecting the respective terminals of $C_{110}$, $C_{120}$ and the laminated busbar A0. It should be noted that the present application is not limited to this, and the power converter of the present application may be achieved in other methods or without the DC laminated busbar.

Figure 7B:
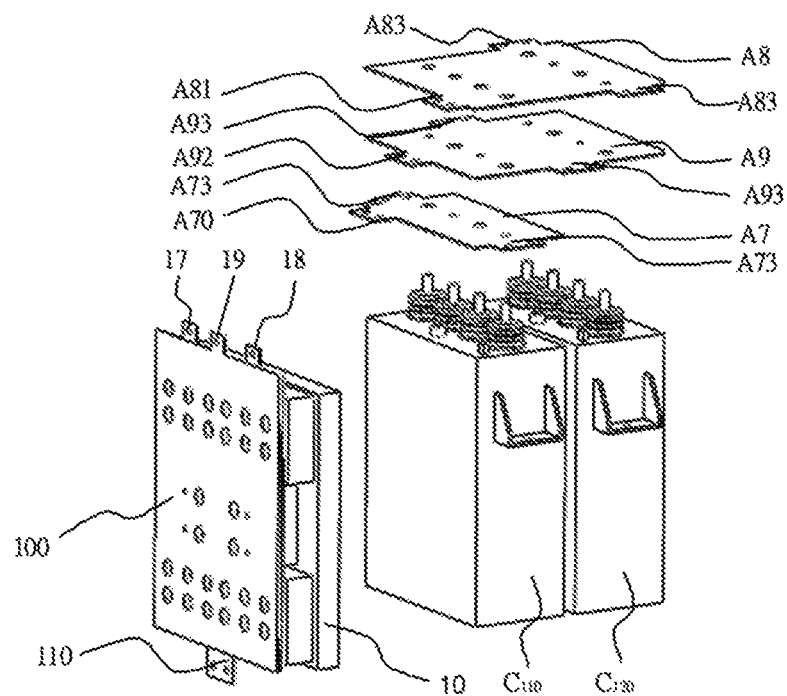
FIG. 7B is an exploded schematic diagram showing the assembly of the power unit in FIG. 7A.

The structure of the power unit is as shown in FIG. 7B. With reference to FIG. 7B, A7 is a busbar for connecting the upper-arm capacitor $C_{110}$, A8 is a busbar for connecting the lower arm capacitor $C_{120}$, and A9 is a neutral-point bus for connecting the neutral-point sub busbar A6 of the laminated busbar A0. The connection between the connector 17 of A0 and the connector A70 of A7 is as a positive DC input. The connection between the connector 18 of A0 and the connector A81 of A8 is as a negative DC input. The connection between the connector 19 of A0 and the connector A92 of A9 is as a neutral point. The AC input/output busbar connector part 110 of A0 is connected to input/output device (for example, a filter or a motor). Meanwhile, the connector A73 of A7 is connected to the upper-arm capacitor busbars of other phases of power units in the power converter, the connector A83 of A8 is connected to the lower-arm capacitor busbars of other phases of power units in the power converter, and the connector A93 of A9 is connected to the other natural-point busbars of other phases of power units in the power converter.

A Second Embodiment

Figure 8A:
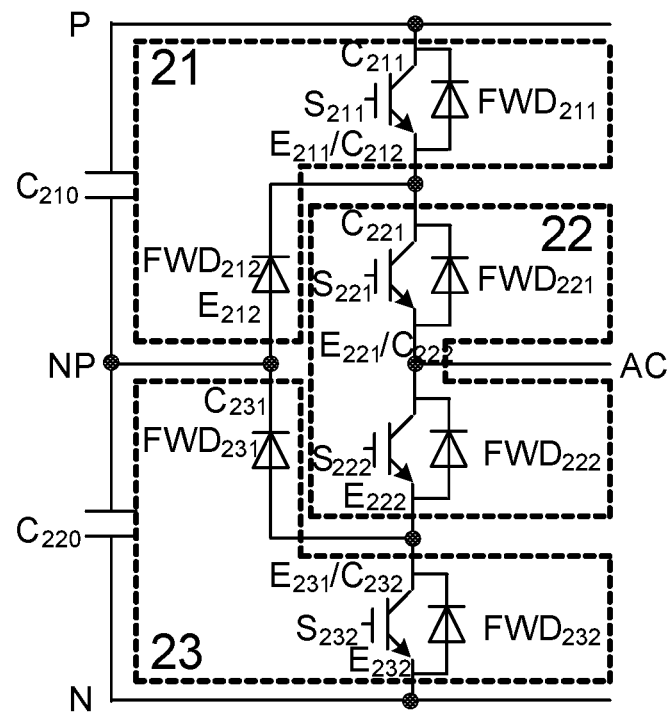
FIG. 8A is a schematic diagram showing a circuit of a power converter having a NPC three-level topology according to a second embodiment of the present application.

As shown in FIG. 8A, in this embodiment, $S_{211}$, $S_{221}$, $S_{222}$ and $S_{232}$ are semiconductor components, $FWD_{211}$, $FWD_{221}$, $FWD_{222}$ and $FWD_{232}$ are freewheeling diodes, $FWD_{212}$ and $FWD_{231}$ are clamping diodes, $C_{210}$ is an upper-arm busbar capacitor, and $C_{220}$ is a lower-arm busbar capacitor.

The difference between the second embodiment and the first embodiment lies in that there are only three the semiconductor modules. In this embodiment, the semiconductor components $S_{211}$, $FWD_{211}$ and $FWD_{212}$ constitute a semiconductor module 21, the semiconductor components $S_{221}$, $FWD_{221}$, $D_{221}$, $S_{222}$ and $FWD_{222}$ constitute a semiconductor module 22, and the semiconductor components $S_{232}$, $FWD_{231}$ and $FWD_{232}$ constitute a semiconductor module 23. The plurality of semiconductor modules form a power unit component group 211.

Figure 8B:
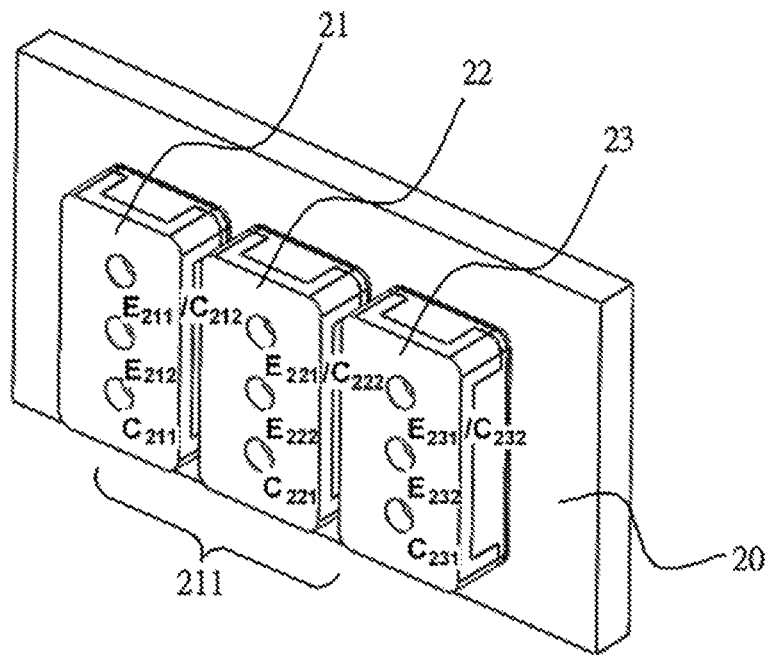
FIG. 8B is a schematic diagram showing a component distribution of the power converter having the NPC three-level topology according to the second embodiment of the present application.

As shown in FIG. 8B, the power unit component group 211 comprises semiconductor module 21, 22 and 23, which are located in the same plane. All of the semiconductor modules in 211 are fixed on the same heat sink 20.

In this embodiment, since the semiconductor components $S_{211}$, $FWD_{211}$ and $FWD_{212}$ are contained in the semiconductor module 21, $S_{211}$, $FWD_{211}$ and $FWD_{212}$ share a common connection pin $E_{211}/C_{212}$. Likewise, the semiconductor components $S_{221}$, $FWD_{221}$ and $S_{222}$, $FWD_{222}$ share a common connection pin $E_{221}/C_{222}$, and the semiconductor components $S_{232}$, $FWD_{23}$ and the clamping diode $FWD_{231}$ share a common connection pin $E_{231}/C_{232}$.

Therefore, as shown in FIG. 8B, there are only three pins led outside each of the semiconductor modules. For example, the pins led from the semiconductor module 21 are $E_{211}/C_{212}$, $E_{212}$ and $C_{211}$, and other semiconductor modules are in the same manner.

Figure 9A:
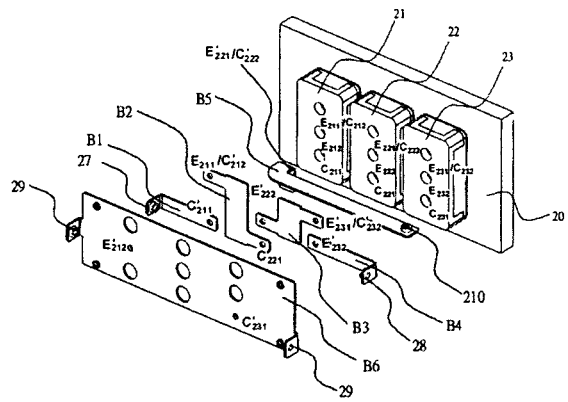
FIG. 9A is a schematic diagram showing the structure of each phase power unit in the power converter having the NPC three-level topology according to the second embodiment of the present application.
Figure 11A:
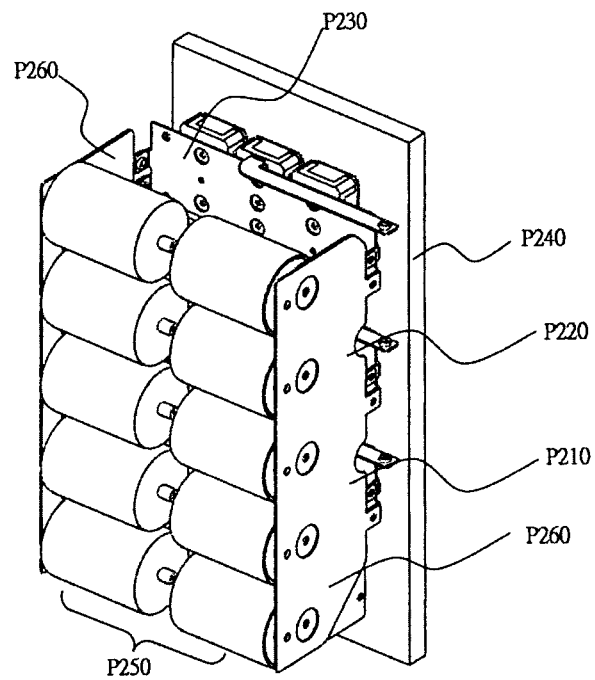
FIG. 11A is a schematic diagram showing the assembly of the power converter having the NPC three-level topology according to the second embodiment of the present application.

With reference to FIGS. 9A and 11A, take one phase of power unit 200 in the power converter as an example to illustrate the structure of the power converter according to this embodiment. The power unit 200 mainly comprises a heat sink 20, a power unit component group 211 including semiconductor modules 21, 22 and 23, and sub busbars B1, B2, B3, B4, B5 and B6, each of the sub busbars being divided into conductor part and connector part by function.

In this embodiment, the respective sub busbars are connected to the components in the power unit respectively. Specifically, in the laminated busbar B0 according to this embodiment, a pin $C_{211}$ of the conductor module 21 is electrically connected to a connection hole $C_{211}'$ of the sub busbar B1, and a connector 27 of the sub busbar B1 is used as a positive DC input terminal, which is connected to an positive DC input bus via a upper-arm capacitor $C_{210}$. A pin $E_{211}/C_{212}$ of the semiconductor module 21 and a pin $C_{221}$ of the semiconductor module 22 are electrically connected to connection holes $E_{211}'/C_{212}'$ and $C_{221}'$ of the sub busbar B2, respectively. A pin $E_{222}$ of the semiconductor module 22 and a pin $E_{231}/C_{232}$ of the semiconductor module 23 are electrically connected to connection holes $E_{222}'$, $E_{231}'/C_{232}'$ of the sub busbar B3, respectively. A pin $E_{232}$ of the semiconductor module 23 is electrically connected to a connection hole $E_{232}'$ of the sub busbar B4, and a connector 28 of the sub busbar B4 is used as a negative DC input terminal, which is connected to a negative DC input bus via a lower-arm capacitor $C_{220}$. A pin $E_{221}/C_{222}$ of the semiconductor module 22 is electrically connected to a connection hole $E_{221}'/C_{222}'$ of the sub busbar B5, and a connector 210 of the sub busbar B5 is used as an AC input/output terminal. A pin $E_{212}$ of the semiconductor module 21 and a pin $C_{231}$ of the semiconductor module 23 are electrically connected to connection holes $E_{212}'$ and $C_{231}'$ of the neutral-point sub busbar B6, respectively, and a connector 29 of the neutral-point sub busbar B6 is used as a neutral-point connection terminal, which is connected to the upper-arm capacitor $C_{210}$ and the lower-arm capacitor $C_{220}$.

Figure 9B:
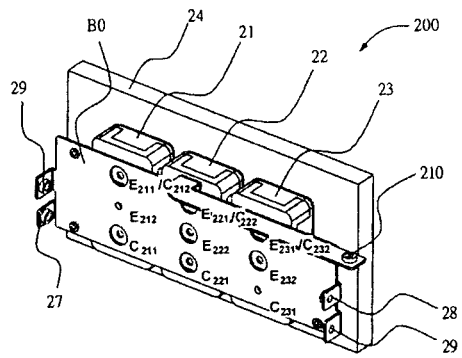
FIG. 9B is a schematic diagram showing the structure of the laminated busbar according to the second embodiment of the present application.

In FIG. 9B, the connector 27 of the laminated busbar B0 composed of the sub busbars B1, B2, B3, B4, B5 and B6 (that is, the connector of the sub busbar B1) is connected to a positive DC input bus of the power converter, the connector 28 (that is, the connector of the sub busbar B4) is connected to a negative DC input bus of the power converter, the connector 29 (that is, the connector of the sub busbar B6) is connected to a neutral-point potential bus of the power converter, and the connector 210 (that is, the connector of the sub busbar B5) is connected to an AC input/output bus.

As shown in FIG. 9B, in this embodiment, the laminated busbar B0 is disposed over the power unit component group 211. The laminated busbar B0 comprises two layers. The first layer is a neutral-point sub busbar B6, which is a neutral-point potential bus of one phase of NPC three-level topology with connector 29. The second layer comprises a plurality of sub busbars B1-B5, which is configured to make electrical connections between the semiconductor modules and the positive DC input busbar, the negative DC input busbar, the AC input/output busbar and electrical connections between the respective semiconductor modules with connector 27, 28 and 210.

Figure 9C:
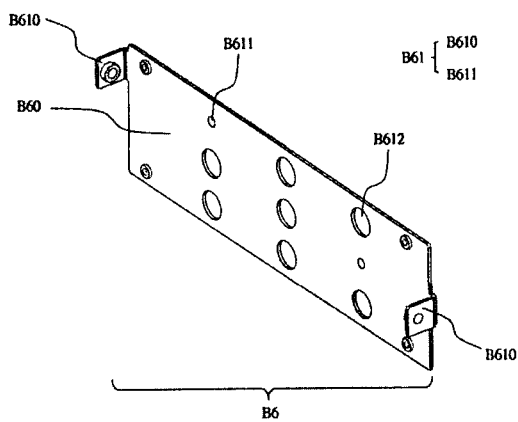
FIG. 9C is a schematic diagram showing the structure of a sub busbar B6 according to the second embodiment of the present application.

Therefore, in this embodiment, the laminated busbar B0 comprises six sub busbars B1-B6. With reference to FIG. 9C, this embodiment takes the sub busbar B6 as an example to explain the structure of each. As shown in FIG. 9C, the sub busbar B6 comprises conductor part B60 and connector part B61. B60 is used for providing a flow path for current in the switching component modules. B61 is used for connecting B60 to external device such as semiconductor component module, capacitor, motor, cable or the like, in an effective connection manner. Depending to different connection objects, B61 may comprise at least one of connection terminals B610, connection holes B611, and through holes B612, and so on. For example, B61 may be implemented as connector 29 in FIG. 9A, and connector 29 only comprises connectional terminals and connection holes. Likewise, in other sub busbars, the connector may be implemented as connector 27 and 28 in FIG. 9A, and connector 27 and 28 also comprise connection terminals and connection holes.

In the present application, as required, the connector part may be implemented in various manners, for example, bending toward space, rivet, protrusion or concave, bolt, buckle, connection hole and through hole in various shapes, and so on. According to an example of the present application, as connecting semiconductor modules by means of holes, each of the sub busbars in the laminated busbar is perforated in the positions corresponding to the positions of the respective components in the semiconductor modules. The holes may be classified into two types according to diameter of hole. A small hole having a smaller diameter is a connection hole, and each of sub busbars is electrically connected to corresponding pins of semiconductor modules via connection holes thereon. A big hole having a bigger diameter is a through hole, and the through holes in each of sub busbars are not electrically connected to the pins of semiconductor modules. The drawings only indicate an example that holes are round holes, but those skilled in the art should appreciate that the shape of hole is not limed to this, and may be hole in various shapes such as ellipse hole, square hole, and so on, as long as the hole can implement the functions of the above connection hole or the above through hole and be distinguished from each other according to the above two functions.

The laminated busbar B0 further comprises an insulating material portion. The insulating material portion is sandwiched between the two sub busbars having different operation voltages and stacked together. Take the laminated busbar B0 as an example, an insulating layer exists between the upper and lower layers of busbars, and the insulating layer may be attached to a surface of the sub busbar B6, or may be attached to surfaces of the sub busbars B1, B2, B3, B4 and B5, or may be attached to the surfaces of the sub busbars B1, B2, B3, B4, B5 and B6 simultaneously. The insulating layer may not be attached to any surface of the sub busbars, but independently located between the two layers of the sub busbars, and the effective cling between the upper and lower layers of busbars is achieved by means of laminating, adhesion and so on. As shown in FIG. 9A and FIG. 9B, the neutral-point sub busbar B6 is separately disposed at the top of the laminated busbar, and the operation voltages between the other sub busbars in the second layer and the neutral-point sub busbar B6 are half of the whole DC operation voltage of the power converter. However, in the second layer busbar, the insulation voltages between a plurality of sub busbars, that is, between the sub busbar B1 and the sub busbar B2, between the sub busbar B2 and the sub busbar B3, between the sub busbar B3 and the sub busbar B5, between the sub busbar B2 and the sub busbar B5, are half of the whole DC operation voltage.

In this embodiment, the laminated busbar is arranged in two layers of busbars, which makes currents flowing through the upper and lower layers of busbars mirror symmetry substantially, thus effectively reducing stray inductance in the power converter, and further reducing voltage stress to the semiconductor components. Further, the neutral-point sub busbar arranged in one of two layers may completely cover all of busbars arranged in another layer, which further reduces stray inductance in the power converter.

Hereafter, the influence of laminated busbar according to this embodiment on the stray inductance in NPC three-level power converter will be described with reference to FIGS. 10A-10D.

Figure 10A:
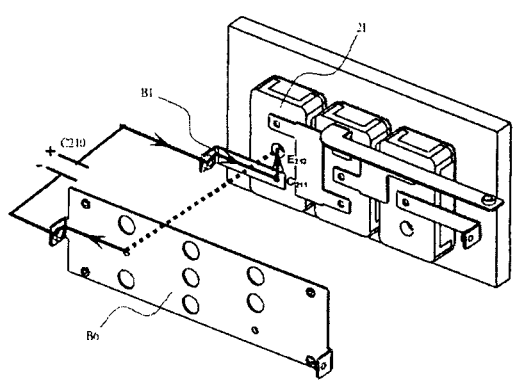
FIG. 10A is a schematic diagram showing a distribution of a commutation loop 1 in the laminated busbar according to the second embodiment of the present application.
Figure 10B:
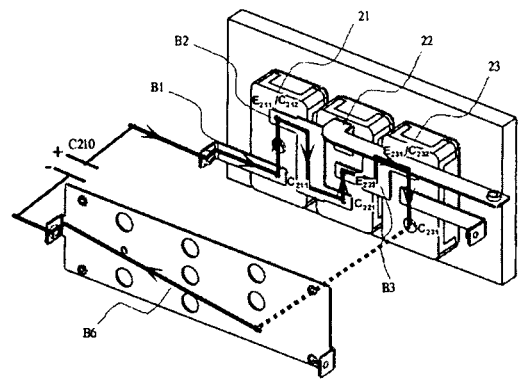
FIG. 10B is a schematic diagram showing a distribution of a commutation loop 2 in the laminated busbar according to the second embodiment of the present application.
Figure 10C:
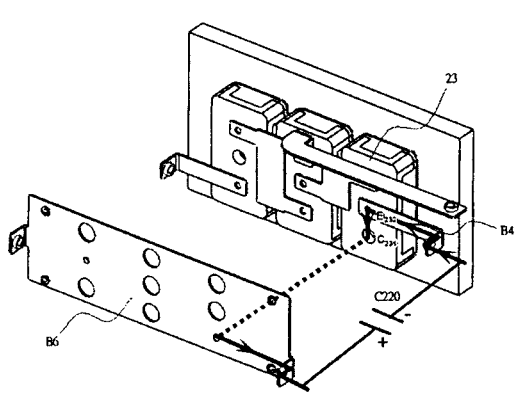
FIG. 10C is a schematic diagram showing a distribution of a commutation loop 3 in the laminated busbar according to the second embodiment of the present application.
Figure 10D:
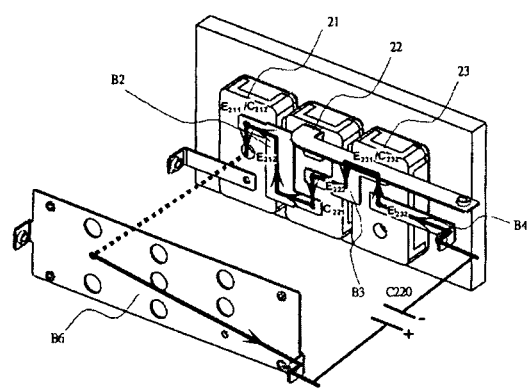
FIG. 10D is a schematic diagram showing a distribution of a commutation loop 4 in the laminated busbar according to the second embodiment of the present application.

FIG. 10A is a schematic diagram showing a distribution of a commutation loop 1 in the laminated busbar according to the second embodiment of the present application. FIG. 10B is a schematic diagram showing a distribution of a commutation loop 2 in the laminated busbar according to the second embodiment of the present application. FIG. 10C is a schematic diagram showing a distribution of a commutation loop 3 in the laminated busbar according to the second embodiment of the present application. FIG. 10D is a schematic diagram showing a distribution of a commutation loop 4 in the laminated busbar according to the second embodiment of the present application.

With reference to FIG. 3A and FIG. 10A, at the time when semiconductor component $S_{211}$ is turned off, commutating loop 1 flows through sub busbar B1, inside of semiconductor module 21, and neutral-point sub busbar B6. Specifically, the current in the commutation loop 1 flows through the path of $C_{210}$-$C_{211}$-$E_{212}$-$C_{210}$, that is, beginning from anode terminal of upper-arm busbar capacitor $C_{210}$, to terminal $C_{211}$ of semiconductor module 21 via sub busbar B1, further leading from terminal $E_{212}$ of semiconductor module 21, ending at cathode terminal of upper-arm busbar capacitor $C_{210}$, that is, anode terminal of lower-arm busbar capacitor $C_{220}$, via sub busbar B6. Since B6 and B1 are located on the different planes, and preferably B6 completely covers B1, current path of commutation loop 1 is overlapped, and thus the generated stray inductance is very small. The more commutation loop 1 overlaps, the smaller stray inductance commutation loop 1 causes.

With reference to FIG. 3B and FIG. 10B, at the time when semiconductor component $S_{222}$ is turned off, commutation loop 2 flows through the sub busbar B1, semiconductor module 21, sub busbar B2, semiconductor module 22, sub busbar B3, semiconductor module 23, and neutral-point sub busbar B6. Specifically, the current in the commutation loop 2 flows through the path of $C_{210}$-$C_{211}$-$E_{211}$/$_{212}$-$C_{221}$-$E_{222}$-$E_{231}$/$C_{232}$-$C_{231}$-$C_{210}$, that is, beginning from anode terminal of upper-arm busbar capacitor $C_{210}$, to terminal $C_{211}$ of semiconductor module 21 via sub busbar B1, further leading from terminal $E_{211}$/$C_{212}$ of semiconductor module 21, to terminal $C_{221}$ of semiconductor module 22 via sub busbar B2, further leading from terminal $E_{222}$ of semiconductor module 22, to terminal $E_{231}$/$C_{232}$ of semiconductor module 23 via sub busbar B3, further leading from terminal $C_{231}$ of semiconductor module 23, and ending at cathode terminal of the upper-arm busbar capacitor $C_{210}$ via sub busbar B6. Since B6 and B1, B2, B3 are located on the different planes, and preferably B6 completely covers them, current path of commutation loop 2 is overlapped, and thus the generated stray inductance is very small. The more commutation loop 2 overlaps, the smaller stray inductance commutating loop 2 causes.

With reference to FIG. 3C and FIG. 10C, at the time when semiconductor component $S_{232}$ is turned off, commutation loop 3 flows through sub busbar B4, semiconductor module 23 and neutral-point sub busbar B6. Specifically, the current in the commutation loop 3 flows through the path of $C_{220}$-$C_{231}$-$E_{232}$-$C_{220}$, that is, beginning from anode terminal of the lower-arm busbar capacitor $C_{220}$, to terminal $C_{231}$ of the semiconductor module 23 via neutral-point sub busbar B6, further leading from terminal $E_{232}$ of semiconductor module 23, and ending at cathode terminal of lower-arm busbar capacitor $C_{220}$ via sub busbar B4. Since B6 and B4 are located on the different planes, and preferably B6 completely covers B4, the current path of commutation loop 3 is overlapped, and thus the generated stray inductance is very small. The more the commutation loop 3 overlaps, the smaller stray inductance commutating loop 3 causes.

With reference to FIG. 3D and FIG. 10D, at the time when semiconductor component $S_{221}$ is turned off, commutating loop 4 flows through sub busbar B4, semiconductor module 23, sub busbar B3, semiconductor module 22, sub busbar B2, semiconductor module 21 and neutral-point sub busbar B6. Specifically, the current in the commutation loop 4 flows through the path of $C_{220}$-$E_{212}$-$E_{211}$/$C_{212}$-$C_{221}$-$E_{222}$-$E_{231}$/$C_{232}$-$E_{232}$-$C_{220}$, that is, beginning from anode of lower-arm busbar capacitor $C_{220}$, to terminal $E_{212}$ of semiconductor module 21 via neutral-point sub busbar B6, further leading from terminal $E_{211}$/$C_{212}$ of semiconductor module 21, to terminal $C_{221}$ of semiconductor module 22 via sub busbar B2, further leading from terminal $E_{222}$ of semiconductor module 22, to terminal $E_{231}$/$C_{232}$ of semiconductor module 23 via sub busbar B3, further leading from terminal $E_{232}$ of semiconductor module 23, and ending at cathode terminal of the lower-arm busbar capacitor $C_{220}$ via sub busbar B4. Since B6 and B2, B3, B4 are located on the different planes, and B6 preferably completely covers them, the current path of commutation loop 4 is overlapped, and thus the generated stray inductance is very small. The more commutation loop 4 overlaps, the smaller stray inductance commutating loop 4 causes.

As described above, the second embodiment of the present application provides mirror path for currents at the commutation step in principle, reduces the area of commutation loop, and thus effectively reduces stray inductance. As compared with multiple layers of laminated busbars, stray inductance in the present application may be reduced more. Meanwhile, the laminated busbar arrangement only comprises two layers, and for the connections between the respective sub busbars in each of the two layers and the semiconductor modules, it is not required to make a specific process, and thus the laminated busbar according to this embodiment have a structure which is simplified and easy to manufacture.

Hereafter, an assembly of the power converter having a NPC three-level topology according to this embodiment will be described with reference to FIG. 11A and FIG. 11B.

Different from the first embodiment, this embodiment takes a three phase circuit of the power converter as an example to illustrate the whole electrical assembly.

As shown in FIG. 11A, the whole assembly of the three phase power unit of the power converter comprises respective phase power units P210, P220 and P230 implemented by this embodiment, heat sink P240, capacitor device group P250 and DC laminated busbar P260. Here, similar to the first embodiment, the power converter in this embodiment preferably provides DC laminated busbar P260 for connecting the respective busbar connection parts of upper-arm capacitor $C_{210}$, lower-arm capacitor $C_{220}$ and laminated busbar B0. It should be noted that the present application is not limited to this, and the power converter of the present application may be implemented in other manner or without the DC laminated busbar.

Figure 11B:
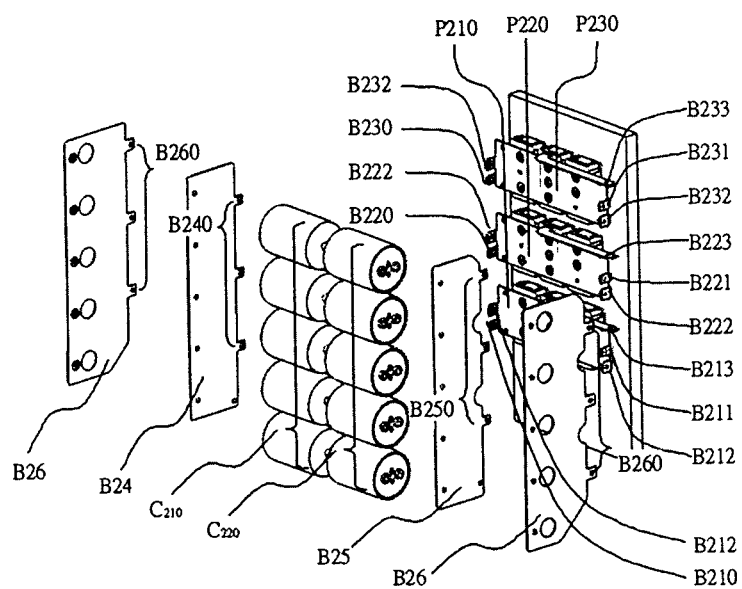
FIG. 11B is an exploded schematic diagram showing the assembly of the power converter in FIG. 11A.

The structure of the power converter according to this embodiment is shown in FIG. 11B. With reference to FIG. 11B, upper-arm busbar capacitor $C_{210}$ and lower-arm busbar capacitor $C_{220}$ are disposed oppositely. The power units P210, P220 and P230 are implemented by the form of the power unit described in the second embodiment of the present application. B24 is an upper-arm capacitor busbar, B25 is a lower-arm capacitor busbar, and B26 is a neutral-point bulbar. The connector B210 of P210, connector B220 of P220 and connector B230 of P230 are respectively connected to connector B240 of the upper-am capacitor busbar B24, so as to being used as positive DC input, and B24 is connected to upper-arm capacitor $C_{210}$ via connection holes thereon. The connector B211 of P210, connector B221 of P220, and connector B231 of P230 are respectively connected to negative DC input of the lower-arm capacitor busbar B25, so as to being used as negative DC input, and B25 is connected to the lower-arm capacitor $C_{220}$ via connection holes thereon. The connector B212 of P210, connector B222 of P220 and connector B232 of P230 are respectively connected to connector B260 of the neutral point busbar B26, so as to being used as neutral point. The connector B213 of P210, connector B223 of P220, connector B233 of P230 are respectively connected to input/output device (for example, motor), so as to being used as AC input/output terminal.

The laminated busbar and the power converter with the laminated busbar according to the present application have been described by the first embodiment and the second embodiment. For those skilled in the art, the foregoing description of the exemplary embodiments of the application has been presented only for the purposes of illustration and description and is not intended to be exhaustive or to limit the application to the precise forms disclosed. Many modifications and variations are possible in light of the above teaching. Therefore, as the power conversion part of a variable frequency converter, the power converter may employ the structure of the laminated busbar described in the embodiment and may also employ the structure of the laminated busbar modified in the embodiment.

In addition, since the variable frequency converter is mainly composed of rectifier (converting alternating current to direct current), filter, inverter (converting direct current to alternating current), control unit, driver unit, detection unit and micro process unit, those skilled in the art may understand that the present application may be extended to any variable frequency converter having the above laminated busbar structure.

The embodiments were chosen and described in order to explain the principles of the application and their practical application so as to activate others skilled in the art to utilize the application and various embodiments and with various modifications as are suited to the particular use contemplated. Alternative embodiments will become apparent to those skilled in the art to which the present application pertains without departing from its spirit and scope. Accordingly, the scope of the present application is defined by the appended claims rather than the foregoing description and the exemplary embodiments described therein.

What is claimed is:

1. A laminated busbar for use in a NPC three-level power converter, comprising:
   a first layer of busbar comprising a neutral-point sub busbar, configured to make electrical connections between respective components in the NPC three-level power converter and a neutral-point potential; and
   a second layer of busbar comprising a plurality of sub busbars, configured to make electrical connections between the respective components in the NPC three-level power converter and a positive DC input, a negative DC input and an AC input/output in the NPC three-level power converter and electrical connections between the respective components, wherein, the NPC three-level power converter comprises:

a first semiconductor module comprising a first semiconductor component located at an upper arm of the NPC three-level power converter and a first freewheeling diode connected in parallel with the first semiconductor component;

a second semiconductor module comprising a second semiconductor component located at an upper arm of the NPC three-level power converter and a second freewheeling diode connected in parallel with the second semiconductor component;

a third semiconductor module comprising a third semiconductor component located at a lower arm of the NPC three-level power converter and a third freewheeling diode connected in parallel with the third semiconductor component;

a fourth semiconductor module comprising a fourth semiconductor component located at a lower arm of the NPC three-level power converter and a fourth freewheeling diode connected in parallel with the fourth semiconductor component;

a fifth semiconductor module comprising a first clamping diode, a terminal of which is connected between the first semiconductor component module and the second semiconductor module, and another terminal of which is connected to the neutral-point potential of the NPC three-level power converter; and a sixth semiconductor module comprising a second clamping diode, a terminal of which is connected between the third semiconductor module and the fourth semiconductor module, and another terminal of which is connected to the neutral-point potential of the NPC three-level power converter;

wherein the second layer of busbar comprises:
 a first sub busbar configured to make electrical connection between the first semiconductor module and the positive DC input;
 a second sub busbar configured to make electrical connections between the first semiconductor module, the second semiconductor module and the fifth semiconductor module;
 a third sub busbar configured to make electrical connections between the third semiconductor module, the fourth semiconductor module and the fifth semiconductor module;
 a fourth sub busbar configured to make electrical connection between the fourth semiconductor module and the negative DC input; and
 a fifth sub busbar configured to make electrical connections between the second semiconductor module, the third semiconductor module and the AC input/output; and wherein the neutral-point sub busbar is respectively connected to another terminal of the first clamping diode and another terminal of the second clamping diode.

2. A laminated busbar for use in a NPC three-level power converter, comprising:
 a first layer of busbar comprising a neutral-point sub busbar, configured to make electrical connections between respective components in the NPC three-level power converter and a neutral-point potential; and
 a second layer of busbar comprising a plurality of sub busbars, configured to make electrical connections between the respective components in the NPC three-level power converter and a positive DC input, a negative DC input and an AC input/output in the NPC three-level power converter and electrical connections between the respective components, wherein, the NPC three-level power converter comprises:
 a first semiconductor module comprising a first semiconductor component and a first clamping diode located at an upper arm of the NPC three-level power converter;
 a second semiconductor module comprising a second semiconductor component located at the upper arm of the NPC three-level power converter and a third semiconductor component located at a lower arm of the NPC three-level power converter; and
 a third semiconductor module comprising a fourth semiconductor component and a second clamping diode located at the lower arm of the NPC three-level power converter;
 wherein a terminal of the first clamping diode is connected between the first semiconductor component and the second semiconductor component, and another terminal thereof is connected to a neutral-point potential of the NPC three-level power converter;

the second layer of busbar comprises:
 a first sub busbar configured to make electrical connection between the first semiconductor module and the positive DC input;
 a second sub busbar configured to make electrical connection between the first semiconductor module and the second semiconductor module;
 a third sub busbar configured to make electrical connection between the second semiconductor module and the third semiconductor module;
 a fourth sub busbar configured to make electrical connection between the third semiconductor module and the negative DC input; and
 a fifth sub busbar configured to make electrical connection between the second semiconductor module and the AC input/output; and wherein the neutral-point sub busbar is respectively connected to another terminal of the first clamping diode and another terminal of the second clamping diode.

3. The laminated busbar according to claim 1, wherein, the first layer of busbar is located over the second layer and the first layer of busbar completely covers all of sub busbars in the second layer.

4. The laminated busbar according to claim 2, wherein, the first layer of busbar is located over the second layer and the first layer of busbar completely covers all of sub busbars in the second layer.

5. The laminated busbar according to claim 1, wherein, each of sub busbars in the first layer and the second layer comprises a conductor part and a connector part as main parts; wherein, each of sub busbars is electrically connected to a corresponding semiconductor component module, a common Direct Current input busbar, a natural-point busbar, and an AC input/output busbar of a three-level circuit of the NPC three-level power converter via the busbar connection part thereof.

6. The laminated busbar according to claim 2, wherein, each of sub busbars in the first layer and the second layer comprises a conductor part and a connector part as main parts; wherein, each of sub busbars is electrically connected to a corresponding semiconductor component module, a common Direct Current input busbar, a natural-point busbar, and an AC input/output busbar of a three-level circuit of the NPC three-level power converter via the busbar connection part thereof.

7. A NPC three-level power converter with low stray inductance, comprising:
a semiconductor component group comprising an upper-arm component group connected between a positive DC input and an AC input/output and a lower-arm component group connected between a negative DC input and the AC input/output, wherein, the upper-arm component group further comprises a first clamping diode, a terminal of which is connected to a neutral-point potential located between the upper-arm component group and the lower-arm component group, and the lower-arm component group further comprises a second clamping diode, a terminal of which is connected to the neutral-point potential;
a heat sink, on which the upper-arm component group and the lower-arm component group are mounted; and
a laminated busbar, disposed over the semiconductor component group, and comprising:
a first layer of busbar comprising a neutral-point sub busbar configured to make electrical connections between the first clamping diode, the second clamping diode and the neutral-point potential; and
a second layer of busbar comprising a plurality of sub busbars, configured to make electrical connections between the upper-arm component group and the positive DC input, the AC input/output, electrical connections between the lower-arm component group and the negative DC input, the AC input/output, and electrical connections between respective components in the upper-arm component group and the lower-arm component group, respectively,
wherein, the upper-arm component group further comprises: a first semiconductor module, comprising the first semiconductor component and the first freewheeling diode connected in parallel with the first semiconductor component; a second semiconductor module comprising the second semiconductor component and the second freewheeling diode connected in parallel with the second semiconductor component;
the lower-arm component group further comprises: a third semiconductor module comprising the third semiconductor component and the third freewheeling diode connected in parallel with the third semiconductor component; a fourth semiconductor module comprising the fourth semiconductor component and the fourth freewheeling diode connected in parallel with the fourth semiconductor component; and
the second layer of busbar comprises:
a first sub busbar configured to make electrical connection between the first semiconductor module and the positive DC input;
a second sub busbar configured to make electrical connections between the first semiconductor module, the second semiconductor module and the first clamping diode;
a third sub busbar configured to make electrical connections between the third semiconductor module, the fourth semiconductor module and the second clamping diode;
a fourth sub busbar configured to make electrical connection between the fourth semiconductor module and the negative DC input; and
a fifth sub busbar configured to make electrical connections between the second semiconductor module, the third semiconductor module and the AC input/output.

8. A NPC three-level power converter with low stray inductance, comprising:
a semiconductor component group comprising an upper-arm component group connected between a positive DC input and an AC input/output and a lower-arm component group connected between a negative DC input and the AC input/output, wherein, the upper-arm component group further comprises a first clamping diode, a terminal of which is connected to a neutral-point potential located between the upper-arm component group and the lower-arm component group, and the lower-arm component group further comprises a second clamping diode, a terminal of which is connected to the neutral-point potential;
a heat sink, on which the upper-arm component group and the lower-arm component group are mounted; and
a laminated busbar, disposed over the semiconductor component group, and comprising:
a first layer of busbar comprising a neutral-point sub busbar configured to make electrical connections between the first clamping diode, the second clamping diode and the neutral-point potential; and
a second layer of busbar comprising a plurality of sub busbars, configured to make electrical connections between the upper-arm component group and the positive DC input, the AC input/output, electrical connections between the lower-arm component group and the negative DC input, the AC input/output, and electrical connections between respective components in the upper-arm component group and the lower-arm component group, respectively,
wherein,
the upper-arm component group further comprises a first semiconductor component and a second semiconductor component; and
the lower-arm component group further comprises a third semiconductor component and a fourth semiconductor component;
wherein the first semiconductor component and the first clamping diode constitute a first semiconductor module, the second semiconductor component and the third semiconductor component constitute a second semiconductor module, and the fourth semiconductor component and the second clamping diode constitute a third semiconductor module; and
the second layer of busbar further comprises:
a first sub busbar configured to make electrical connection between the first semiconductor module and the positive DC input;
a second sub busbar configured to make electrical connection between the first semiconductor module and the second semiconductor module;
a third sub busbar configured to make electrical connection between the second semiconductor module and the third semiconductor module;
a fourth sub busbar configured to make electrical connection between the third semiconductor module and the negative DC input; and
a fifth sub busbar configured to make electrical connection between the second semiconductor module and the AC input/output.

9. The power converter according to claim 7, wherein, the first layer of busbar is located over the second layer and the first layer of busbar completely covers all of sub busbars in the second layer.

10. The power converter according to claim 8, wherein, the first layer of busbar is located over the second layer and the first layer of busbar completely covers all of sub busbars in the second layer.

11. The power converter according to claim 7, wherein, each of sub busbars in the first layer of sub busbars and the second layer of sub busbars comprises, a conductor part as a main part, a connector part and an insulating material part; wherein each of sub busbars is electrically connected to the corresponding semiconductor component module, a common DC input, a neutral point bus and an AC input/output of a three-level circuit of the NPC three-level power converter via the busbar connection part thereof, respectively.

12. The power converter according to claim 8, wherein, each of sub busbars in the first layer of sub busbars and the second layer of sub busbars comprises, a conductor part as a main part, a connector part and an insulating material part; wherein each of sub busbars is electrically connected to the corresponding semiconductor component module, a common DC input, a neutral point bus and an AC input/output of a three-level circuit of the NPC three-level power converter via the busbar connection part thereof, respectively.

* * * * *